US006556130B1

(12) United States Patent
Narusawa

(10) Patent No.: US 6,556,130 B1
(45) Date of Patent: Apr. 29, 2003

(54) RADIO SELECTIVE CALLING RECEIVER

(75) Inventor: Hideki Narusawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/571,877

(22) Filed: May 15, 2000

(30) Foreign Application Priority Data

May 18, 1999 (JP) .......................................... 11-136840

(51) Int. Cl.[7] ............................................... H03K 17/00
(52) U.S. Cl. ...................................... 340/7.52; 340/7.51
(58) Field of Search ................................ 340/7.52, 7.53

(56) References Cited

U.S. PATENT DOCUMENTS 4,952,927 A * 8/1990 DeLuca et al. ........ 340/825.44
5,225,826 A * 7/1993 DeLuca et al. ........ 340/825.44
5,473,320 A * 12/1995 DeLuca et al. ........ 340/825.44

FOREIGN PATENT DOCUMENTS

JP 3-226030 10/1991
JP 6-77880 3/1994
JP 7-240802 9/1995
JP 10-42329 2/1998

OTHER PUBLICATIONS

Japanese Official Action dated Feb. 1, 2002 (w/English translation of relevant portions).

* cited by examiner

*Primary Examiner*—Michael Horabik
*Assistant Examiner*—M Shimizu
(74) *Attorney, Agent, or Firm*—Dickstein, Shapiro, Morin & Oshinsky, LLP.

(57) ABSTRACT

A radio selective calling receiver includes a message storage section, display section, memory, and automatic display control section. The message storage section stores all, received messages and date/time information of reception of the messages in correspondence with designated selective calling numbers. The display section displays a message stored in the message storage section. The memory stores at least a display start time of a message for each selective calling number. The automatic display control section reads out a latest received message from the message storage section at the display start time stored in the memory in accordance with the date/time information, and outputting the message to the display section.

32 Claims, 5 Drawing Sheets

| SELECTIVE CALLING NUMBER | DATE INFORMATION OF RECEPTION | RECEIVED MESSAGE |
|---|---|---|
| SELECTIVE CALLING NUMBER "1" | 1999Y03/15 10 : 20<br>1999Y03/01 11 : 20<br>1999Y02/20 15 : 28<br>1999Y02/15 20 : 02 | MESSAGE 6<br>MESSAGE 4<br>MESSAGE 3<br>MESSAGE 2 |
| SELECTIVE CALLING NUMBER "2" | 1999Y03/14 07 : 48<br>1999Y01/01 11 : 03 | MESSAGE 5<br>MESSAGE 1 |

FIG. 3

| SELECTIVE CALLING NUMBER | SETTING | FIRST TIME INDICATING DISPLAY START TIME | SECOND TIME INDICATING DISPLAY END TIME |
|---|---|---|---|
| SELECTIVE CALLING NUMBER "1" | 1 | 15 : 00 | 15 : 30 |
| | 2 | 20 : 00 | 21 : 00 |
| SELECTIVE CALLING NUMBER "2" | 1 | 8 : 00 | 9 : 00 |
| | 2 | - | - |

FIG. 5

RADIO SELECTIVE CALLING RECEIVER

BACKGROUND OF THE INVENTION

The present invention relates to a radio call selective receiver and, more particularly, to a radio call selective receiver capable of displaying the latest received message.

Recently, services of delivering various kinds of information to users by using radio call selective receivers haven been commercially introduced. Specifically, various kinds of information are automatically delivered to a radio call selective receiver, which is assigned a radio call selective number, at predetermined times. The delivered information are stored in the strata section of the radio call selective receiver. The information stored in the storage section are read out and displayed on the display section by switch operation by the user.

Accordingly to the above radio selective calling receiver, however, a large amount of information is stored in the storage section after a lapse of a certain time. For this reason, in order to check the latest information among the stored information, the user must perform numerous switch [operation many times] operations. This is a burdensome procedure.

SUMMARY OF THE INVENTION

It is an object of the present invention to provide a radio selective calling receiver which allows a user to easily check the latest information.

In order to achieve the above object, according to the present invention, there is provided a radio selective calling receiver comprising message storage means for storing all received messages and date/time information of reception of the messages in correspondence with designated selective calling numbers, message display means for displaying a message stored in the message storage means, time storage means for storing at least a display start time of a message for each selective calling number, and display control means for reading out a latest received message from the message storage means at the display start time stored in the time storage means in accordance with the date/time information, and outputting the message to the display means.

BRIEF DESCRIPTION OF THE DRAWINGS

FIG. 3 is a view showing an example of how messages are stored in a message storage section in FIG. 1;

FIG. 5 is a view showing how display start times and display end times are set in the memory of an automatic display control section in FIG. 1 in correspondence with selective calling numbers.

DESCRIPTION OF THE PREFERRED EMBODIMENTS

The present invention will be described in detail below with reference to the accompanying drawings.

Figure 1:
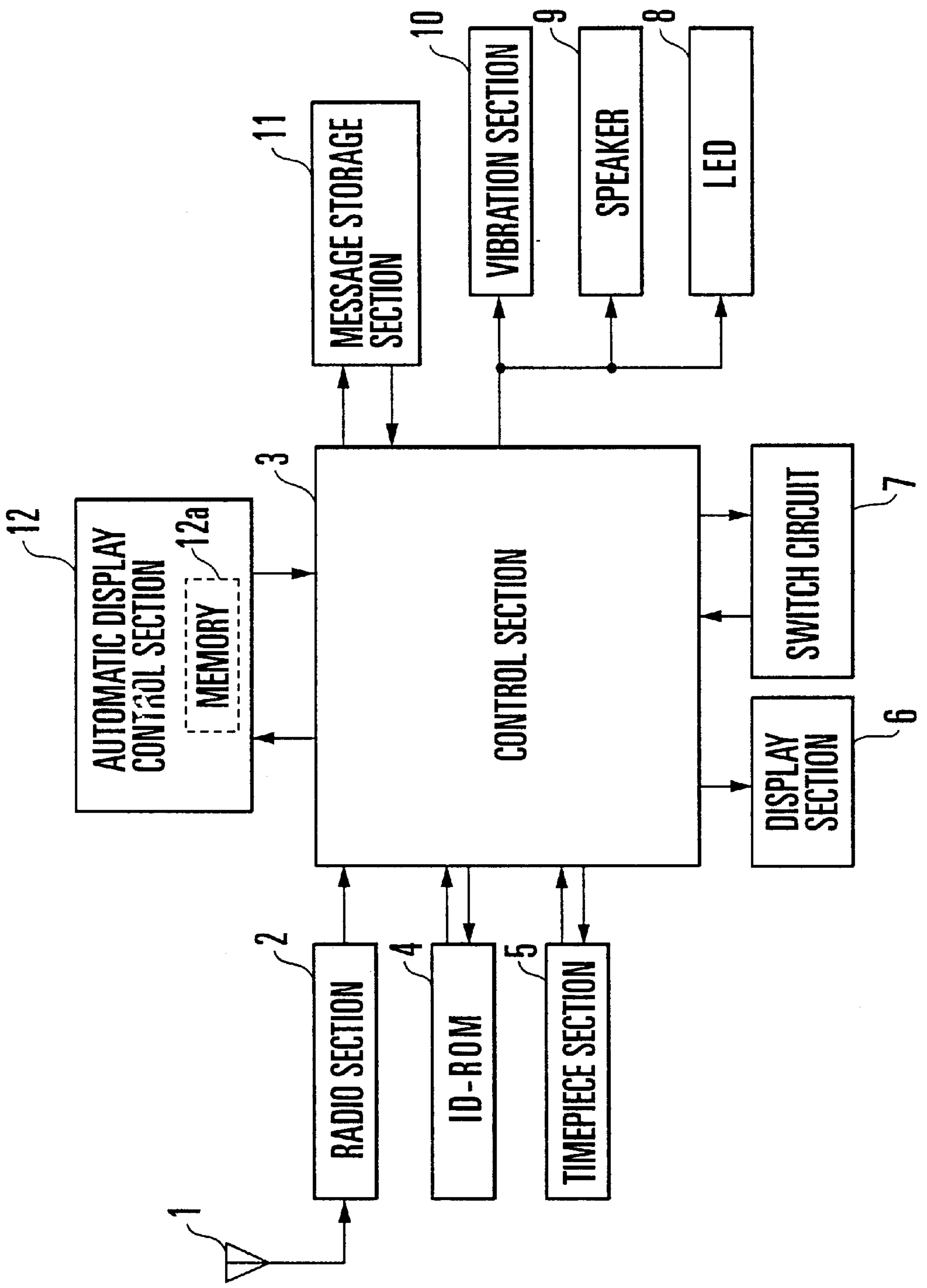
FIG. 1 is a block diagram showing a radio selective calling receiver according to an embodiment of the present invention.

FIG. 1 shows a radio selective calling receiver according to an embodiment of the present invention. In the radio selective calling receiver shown in FIG. 1, a radio section 2 is connected to an antenna 1 for receiving a radio signal, and the radio section 2 demodulates the radio signal received by the antenna 1. A control section 3 is connected to the radio section 2.

In addition, an ID-ROM (Read Only Memory) 4, timepiece section 5, display section 6, switch circuit 7, LED (Light Emitting Device) 8, speaker 9, vibration section 10, message storage section 11, and automatic display control section 12 are connected to the control section 3. The control section 3 performs overall control on these components.

The ID-ROM 4 stores at least one individual selective calling number assigned to the receiver and a selective calling number for the reception of information. The timepiece section 5 measures the current date and time and generates the corresponding information. The display section 6 displays a message received through the radio section 2 and control section 3, and more specifically, the latest message (to be described later), and the current date and time measured by the timepiece section 5.

The switch circuit 7 is used to perform, for example, ringing resetting of the speaker 9, display switching of the display section 6, correction of the current date and time, and reading of a message stored in the message storage section 11. The LED 8 emits light to inform that a message is displayed on the LED 8. The speaker 9 informs it by generating a sound. The vibration section 10 informs it by generating vibrations. The LED 8, speaker 9, and vibration section 10 are driven by the automatic display control section 12 at a display start time. With such informing operation, the user can know the start of display of a message.

The message storage section 11 stores all received messages and date/time information of each received message in correspondence with each selective calling number. The automatic display control section 12 has a memory 12*a* storing a display start time and display end time set for each selective calling number. At the display start time stored in the memory 12*a*, the automatic display control section 12 reads out the latest received message corresponding to the corresponding selective calling number and displays it on the display section 6 in cooperation with the control section 3. At the display end time, the display of the latest received message is terminated.

Operation of setting a display start time and display end time with respect to the automatic display control section 12 will be described next. These times are set by using the control section 3, display section 6, switch circuit 7, and message storage section 11 as follows.

First of all, the control section 3 loads a display start time and display end time for each selective calling number input by the operation of the switch circuit 7, and then displays the display start time and display end time on the display section 6. The displayed display start time and display end time are selected and determined by using the switch circuit 7 and stored in the memory 12*a* of the automatic display control section 12. Since the user can set a display start time and display end time in this manner, display can be performed at the time desired by the user.

Assume that the delivery time of an important or preferential information message has been determined for the user who uses the radio selective calling receiver having a selective calling number for the reception of information. In this case, time immediately after this delivery time may be set as a display start time. With this setting, an important or preferential information message is automatically displayed on the display section 6. Upon reception of a message, therefore, the uses can easily and timely check the important information message without performing any operation.

Message receiving operation will be described next.

A radio signal received through the antenna 1 is demodulated by the radio section 2 and sent to the control section 3. The control section 3 compares at least one individual selective calling number stored in the ID-ROM 4 with the selective calling number contained in the received data. If the comparison result indicates that the received selective calling number coincides with one of the stored selective calling numbers, it is determined that selective calling is performed, and the following message receiving operation is performed. Assume that two selective calling numbers "1" and "2" for the reception of information are stored in the ID-ROM 4.

Figure 2:
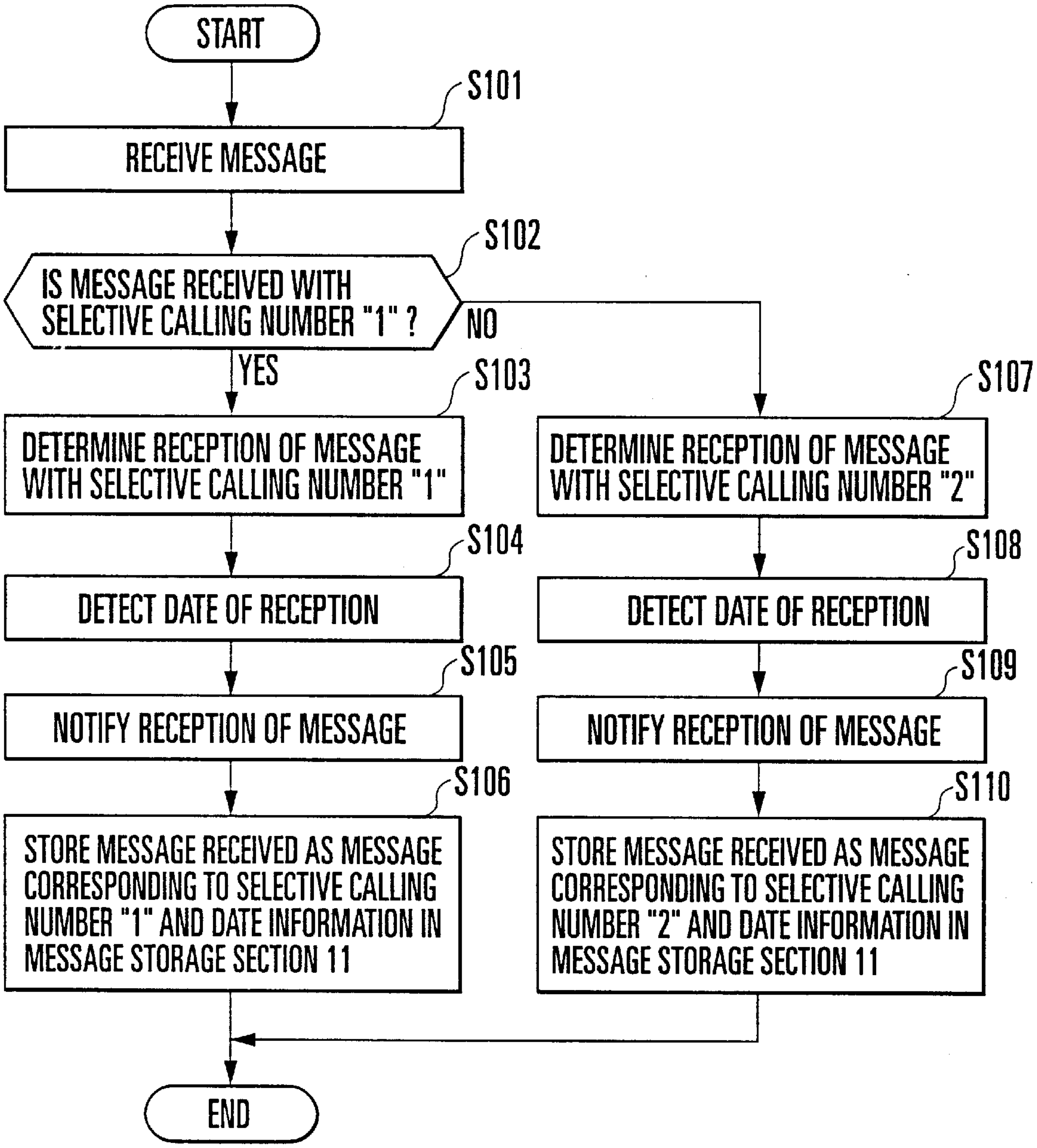
FIG. 2 is a flow chart for explaining the message receiving operation of the radio selective calling receiver shown in FIG. 1.

The message receiving operation will be described with reference to FIG. 2.

In step S101, a message corresponding to one of the selective calling numbers "1" and "2" for the reception of information is received through the antenna 1 and radio section 2. In step S102, the control section 3 checks whether the message has been received with the selective calling number "1". In step S103, the control section 3 determines that the message has been received with the selective calling number "1".

In step S104, the control section 3 detects the date when the message was received. In step S105, the control section 3 informs the reception of the message. In step S106, the received message is stored as a message corresponding to the selective calling number "1" in the message storage section 11 while being related to date information.

If it is determined that the message has not been received with the selective calling number "1", it is determined in step S107 that the message has been received with the selective calling number "2". In step S108, the control section 3 detects the date when the message was received. In step S109, the control section 3 informs the reception of the message in a conventional manner. In step S110, the received message is stored as a message corresponding to the selective calling number "2" in the message storage section 11 while being related to date information.

FIG. 3 shows an example of the message storage section 11 in which messages are stored. As shown in FIG. 3, the message storage section 11 stores pieces of reception date information and received messages, associated to each other, in correspondence with the respective selective calling numbers.

Message 1 indicates a message received at 11:03 on Jan. 1, 1999. Message 2 indicates a message received at 20:02 on Feb. 15, 1999. Message 3 indicates a message received at 15:28 on Feb. 20, 1999. Message 4 indicates a message received at 11:20 on Mar. 1, 1999. Message 5 indicates a message received at 7:48 on Mar. 14, 1999. Message 6 indicates a message received at 10:20 on Mar. 15, 1999.

Since pieces of reception date information and received messages are associated to each other and stored in the message storage section 11 in correspondence with the respective selective calling numbers in this manner, the user can easily recognize the latest message for each selective calling number.

Operation of automatically displaying the latest received message for each selective calling number will be described next with reference to FIG. 4.

In step S201, the automatic display control section 12 refers to the memory 12*a* to determine that the current time is a display start time. In step S202, the automatic display control section 12 checks whether the display start time corresponds to the selective calling number "1".

If it is determined that the display start time corresponds to the selective calling number "1", the automatic display control section 12 detects the activation of automatic display of the latest message corresponding to the selective calling number "1". In step S204, the control section 3 reads out the latest message corresponding to the selective calling number "1" from the message storage section 11 in accordance with an instruction from the automatic display control section 12.

In step S205, the control section 3 displays the latest message corresponding to the selective calling number "1" on the display section 6 in accordance with an instruction from the automatic display control section 12. If the latest received message cannot be entirely displayed on one screen, the message is displayed from the beginning to the end with a screen scrolling function or the like. This display operation is repeated for a predetermined period of time until the display end time. This operation is performed to display a large amount of information. This applies to step S211 to be described later.

In step S206, the automatic display control section 12 performs monitoring operation to check whether the user has issued an instruction to stop automatic message display operation. If YES in step S207, the automatic display control section 12 immediately stops automatic display of the latest message. This allows the user to stop the display as he/she wishes. In step S208, the automatic display control section 12 returns the display section 6 to the standby state upon reception of the display stop instruction from the user.

If it is determined that the current time is not the display start time corresponding to the selective calling number "1" (step S202), the automatic display control section 12 detects the activation of automatic display of the latest message corresponding to the selective calling number "2" in step S209. In step S210, the control section 3 reads out the latest message corresponding to the selective calling number "2" from the message storage section 11 in accordance with an instruction from the automatic display control section 12. In step S211, the control section 3 causes the display section 6 to display the latest message corresponding to the selective calling number "2" in accordance with an instruction from the automatic display control section 12.

If the user has not issued an instruction to stop automatic message display operation (step S206), the automatic display control section 12 displays the latest message until the display end time stored in the memory 12*a* in step S212. At the display end time, the flow advances to step S208, in which the automatic display control section 12 returns the display section 6 to the standby state.

FIG. 5 shows an example of the memory 12*a* for storing display start times and display end times set for the respective selective calling numbers. In this case, display start times and display end times set for the respective selective calling numbers are stored in two pairs in the memory 12*a* of the automatic display control section 12.

As shown in FIG. 5, in the memory 12*a*, a display start time and display end time are respectively set to 15:00 and 15:30 as automatic display setting 1 at the selective calling number "1". As setting 2 at the selective calling number "1", a display start time and display end time are respectively set to 20:00 and 21:00. As setting 1 at the selective calling number "2", a display start time and display end time are respectively set to 8:00 and 9:00. As setting 2 at the selective calling number "2", no times have been set yet.

A modification of the above embodiment will be described below.

In the above embodiment, the control section 3 and automatic display control section 12 are described as different functional blocks. However, these components may be integrated into one functional block. For example, the automatic display control section 12 may be omitted, and the control section 3 may perform automatic display control. Alternatively, part of the operation of the automatic display control section 12 may be performed mainly by the control section 3. For example, the processing in steps S204 to S208 and S210 to S211 in FIG. 4 may be performed under the control of the control section 3 upon notification of a selective calling number from the automatic display control section 12.

According to the above description, two selective calling numbers are stored in the ID-ROM 4. However, the number of selective calling numbers stored in the ID-ROM 4 is not specifically limited as long as at least one selective calling number is stored.

In addition, according to the method of storing messages in the message storage section 11, date information and time information are stored together to allow easy discrimination of the latest received message for each selective calling number. However, the message storage method is not specifically limited as long as the latest message can be determined. For example, messages may be stored in the order of reception for each selective calling number.

Figure 4:
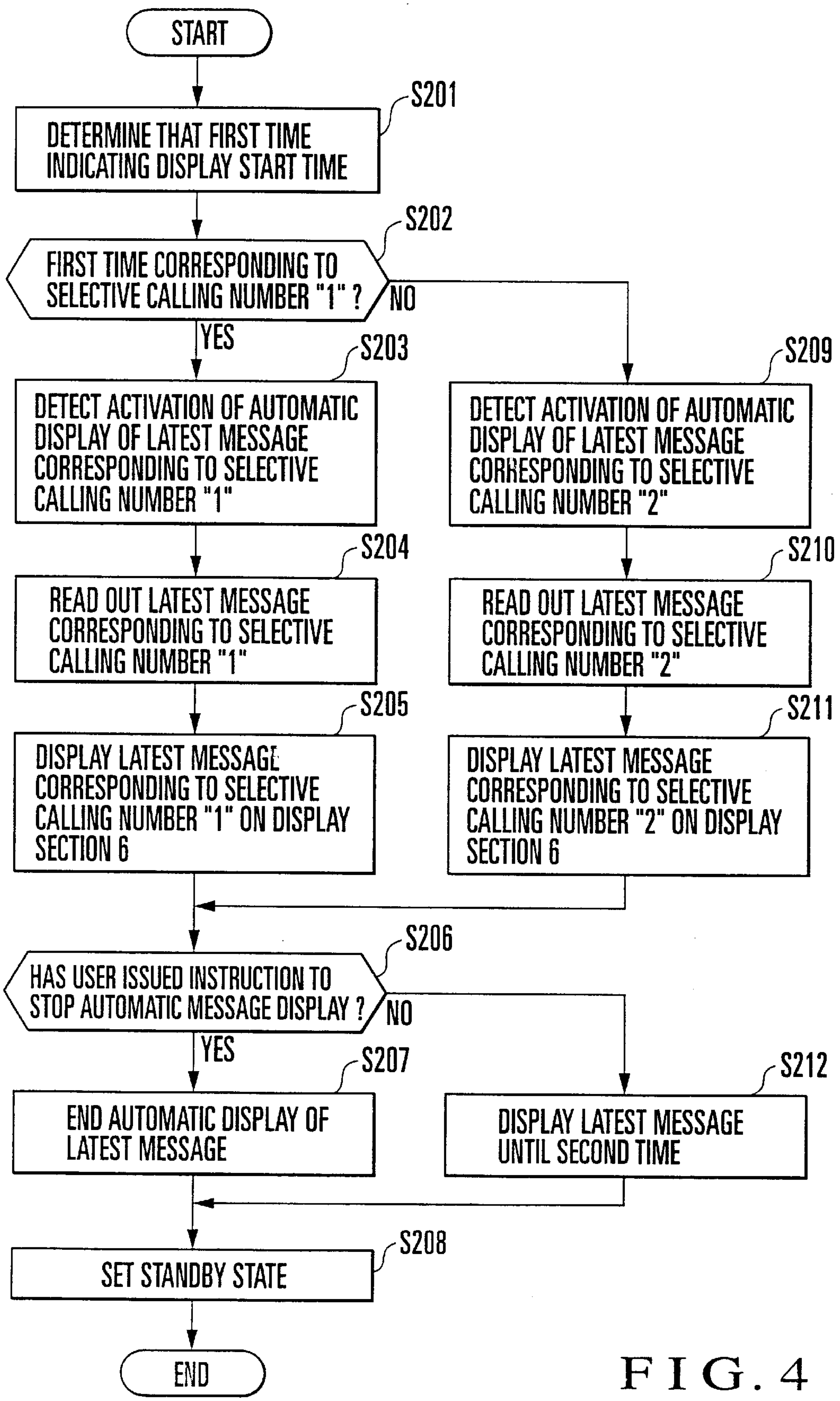
FIG. 4 is a flow chart for explaining how the latest received message is automatically displayed on the radio selective calling receiver in FIG. 1.

According to the above description, in automatically displaying the latest received message for each selective calling number, only the latest received message is displayed on the display section 6 at the display start time (see steps S250 and S211 in FIG. 4). In this case, this message may be displayed, together with some notification means.

In this case, the notification means to be activated is stored in the automatic display control section 12 in advance. At the display start time, the automatic display control section 12 displays the latest received message on the display section 6 while activating the notification means set in advance.

In the above means, the LED 8, speaker 9, and vibration section 10 are used as notification means. However, the notification means to be used are not specifically limited as long as they perform notifying operation.

Furthermore, according to the above description, display start times and display end times are set in two pairs for the respective selective calling numbers. The number of display start times and display end times to be set for the respective selective calling numbers is not limited. This allows information to be displayed timely in accordance with a user's wish.

The display start times and display end times set for the respective selective calling numbers are stored in the memory 12*a* of the automatic display control section 12. However, these set times may be stored in a storage means from which information can be read out by the control section 3 and automatic display control section 12. For example, these times may be stored in the internal memory of the control section 3 or may be stored in an external memory of the control section 3 or automatic display control section 12.

In addition, display start time and display end time are set through the switch circuit 7, control section 3, and automatic display control section 12. However, these times may be stored in the automatic display control section 12 at the same time when selective calling numbers are set in the ID-ROM 4.

According to the above description, only the latest received message is automatically displayed as received message at a display start time. However, the number of received messages to be automatically displayed is not limited. This makes it possible to also display a message received before the latest message, thus displaying messages as many as possible.

In this case, the number of received messages to be automatically displayed for the respective selective calling number is set in the automatic display control section 12. At a display time, the automatic display control section 12 may automatically display messages on the display section 6 by the set number.

Furthermore, display start times and display end times are set. However, display end times need not be set. In this case, automatic display operation may be stopped after a series of latest messages are displayed or a predetermined period of time elapses.

In a service of distributing various pieces of information to ordinary citizens by using the radio selective calling receiver in combination with an electric bulletin board, if a time at which information is updated is determined in advance, the radio selective calling receiver of the present invention can be used. If display start times are set in advance in consideration of information update times, information displayed on the electric bulletin board is automatically switched to the latest information. This operation allows information to be displayed to many users at once.

As has been described above, according to the present invention, the latest received message can be easily checked at a set display start time without requiring any operation. Therefore, a user who uses a radio selective calling receiver having a selective calling number for the reception of information, in particular, can easily and timely check an important or preferential information message immediately after a delivery time.

In general, the latest message is checked by performing switch operation several times, and a current is consumed every time switch operation is performed. According to the radio selective calling receiver of the present invention, since switch operation can be reduced, the battery life can be increased by a reduction in current consumption.

What is claimed is:

1. A radio selective call receiver comprising:

message storage means for storing received messages and date/time information of reception of the messages associated with designated selective calling numbers;

message display means for displaying said messages stored in said message storage means;

time storage means for storing at least one display start time associated with at least one selective calling number; and display control means for reading out a latest message received from said at least one selective calling number from said message storage means at the at least one display start time, and outputting the latest received message to said message display means wherein said display means displays said latest received message.

2. The receiver according to claim 1, further comprising time setting means for setting said at least one display start time in said time storage means.

3. The receiver according to claim 1, wherein when a date and time at which a message is delivered are determined in advance, said at least one display start time is set immediately after a message delivery time.

4. The receiver according to claim 1, wherein said time storage means stores a display end time associated with said at least one display start time of a message, and said display control means instructs said message display means to end display of said latest received message at the display end time.

5. The receiver according to claim 1, wherein said display control means instructs said message display means to display a series of said latest received messages.

6. The receiver according to claim 1, wherein said display control means instructs said message display means to end display of said latest received message when a predetermined period of time has elapsed after said display start time.

7. The receiver according to claim 1, wherein said time storage means stores a plurality of display start times for each said selective calling number.

8. The receiver according to claim 1, wherein said display control means outputs a plurality of received messages including said latest received message to said message display means.

9. The receiver according to claim 1, wherein said display control means instructs said message display means to end display of said latest received message in response to an instruction to stop automatic message display.

10. The receiver according to claim 1, wherein said receiver further comprises notification means for performing one of visible display and audible display that indicate a message is displayed, and said display control means activates said notification means at said display start time at the same time when display of said latest received message is started.

11. The receiver according to claim 10, wherein said notification means comprises at least one of an LED, a speaker, and a vibration section.

12. The receiver according to claim 1, wherein said message display means repeatedly displays said latest received message from the beginning to the end by using a screen scrolling function when the latest received message cannot be entirely displayed on one screen at once.

13. The receiver according to claim 1, wherein said notification means comprises an electronic bulletin board.

14. The receiver according to claim 1, wherein said time storage means stores multiple display start times for said at least one selective calling number.

15. The receiver according to claim 1, wherein said time storage means stores multiple display start times for said designated selective calling numbers.

16. The receiver according to claim 5, wherein said display control means instructs said message display means to end display after said display of a series of said latest received messages.

17. A radio selective call receiver comprising:

a first memory for storing received messages and date/time information of reception of the messages associated with designated selective calling numbers;

a message display for displaying said messages stored in said first memory;

a second memory for storing at least one display start time associated with of at least one selective calling number; and display controller for reading out a latest message received from said at least one selective calling number from said first memory at the at least one display start time, and outputting the latest received message to said message display wherein said message display displays said latest received message.

18. The receiver according to claim 17, further comprising time setter for setting said at least one display start time in said second memory.

19. The receiver according to claim 17, wherein when a date and time at which a message is delivered are determined in advance, said at least one display start time is set immediately after a message delivery time.

20. The receiver according to claim 17, wherein said second memory stores a display end time associated with said at least one display start time of a message, and said display controller instructs said message display to end display of said latest received message at the display end time.

21. The receiver according to claim 17, wherein said display controller instructs said message display to display a series of said latest received messages.

22. The receiver according to claim 17, wherein said display controller instructs said message display to end display of said latest received message when a predetermined period of time has elapsed after said display start time.

23. The receiver according to claim 17, wherein said second memory stores a plurality of display start times for each said selective calling number.

24. The receiver according to claim 17, wherein said display controller outputs a plurality of received messages including said latest received message to said message display.

25. The receiver according to claim 17, wherein said display controller instructs said message display to end display of said latest received message in response to an instruction to stop automatic message display.

26. The receiver according to claim 17, wherein said receiver further comprises a notifier for performing one of visible display and audible display that indicate a message is displayed, and said display controller activates said notifier at said display start time at the same time when display of said latest received message is started.

27. The receiver according to claim 26, wherein said notifier comprises at least one of an LED, a speaker, and a vibration section.

28. The receiver according to claim 17, wherein said message display repeatedly displays said latest received message from the beginning to the end by using a screen scrolling function when the latest received message cannot be entirely displayed on one screen at once.

29. The receiver according to claim 17, wherein said notifier comprises an electronic bulletin board.

30. The receiver according to claim 17, wherein said second memory stores multiple display start times for said at least one selective calling number.

31. The receiver according to claim 17, wherein said second memory stores multiple display start times for said designated selective calling numbers.

32. The receiver according to claim 21, wherein said display controller instructs said message display to end display after said display of a series of said latest received messages.

* * * * *